United States Patent
Bharath et al.

(10) Patent No.: US 12,068,684 B2
(45) Date of Patent: Aug. 20, 2024

(54) MULTI-PHASE SWITCHING REGULATORS WITH HYBRID INDUCTORS AND PER PHASE FREQUENCY CONTROL

(71) Applicant: Intel Corporation, Santa Clara, CA (US)

(72) Inventors: Krishna Bharath, Phoenix, AZ (US); Christopher Schaef, Hillsboro, OR (US); William J. Lambert, Tempe, AZ (US); Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 817 days.

(21) Appl. No.: 17/030,132

(22) Filed: Sep. 23, 2020

(65) Prior Publication Data
US 2022/0094263 A1    Mar. 24, 2022

(51) Int. Cl.
*H02M 3/04* (2006.01)
*H01F 27/24* (2006.01)
*H01L 49/02* (2006.01)
*H03K 19/21* (2006.01)

(52) U.S. Cl.
CPC .............. *H02M 3/04* (2013.01); *H01F 27/24* (2013.01); *H01L 28/10* (2013.01); *H03K 19/21* (2013.01)

(58) Field of Classification Search
CPC .... H02M 3/156; H02M 3/158; H02M 3/1584; H01L 27/24; H01L 28/10
See application file for complete search history.

(56) References Cited

U.S. PATENT DOCUMENTS

| | | | | |
|---|---|---|---|---|
| 4,799,239 A | * | 1/1989 | Pearlman | H04L 27/2335 375/334 |
| 4,843,331 A | * | 6/1989 | Yang | H03M 5/12 327/237 |
| 5,907,482 A | * | 5/1999 | Otake | H02M 3/1584 363/39 |
| 5,963,071 A | * | 10/1999 | Dowlatabadi | H03K 5/00006 327/276 |
| 7,456,618 B2 | * | 11/2008 | Jain | H02M 3/157 323/272 |
| 8,547,076 B1 | * | 10/2013 | Ikriannikov | H02M 3/1584 323/283 |
| 9,083,332 B2 | * | 7/2015 | Ikriannikov | H01L 25/16 |
| 10,396,771 B2 | * | 8/2019 | Li | G06F 1/26 |
| 2005/0093525 A1 | * | 5/2005 | Walters | H02M 3/1584 323/272 |
| 2017/0060205 A1 | * | 3/2017 | Bharath | G06F 1/26 |
| 2017/0207721 A1 | * | 7/2017 | Li | H02M 3/1584 |
| 2021/0104351 A1 | * | 4/2021 | Hosotani | H01F 17/0006 |

* cited by examiner

*Primary Examiner* — Gary L Laxton
(74) *Attorney, Agent, or Firm* — Schwabe, Williamson & Wyatt P.C.

(57) ABSTRACT

Embodiments disclosed herein include inductor arrays. In an embodiment, an inductor array comprises a first inductor with a first inductance. In an embodiment, the first inductor is switched at a first frequency. In an embodiment, the inductor array further comprises a second inductor with a second inductance that is different than the first inductance. In an embodiment, the second inductor is switched at a second frequency that is different than the first frequency.

25 Claims, 11 Drawing Sheets

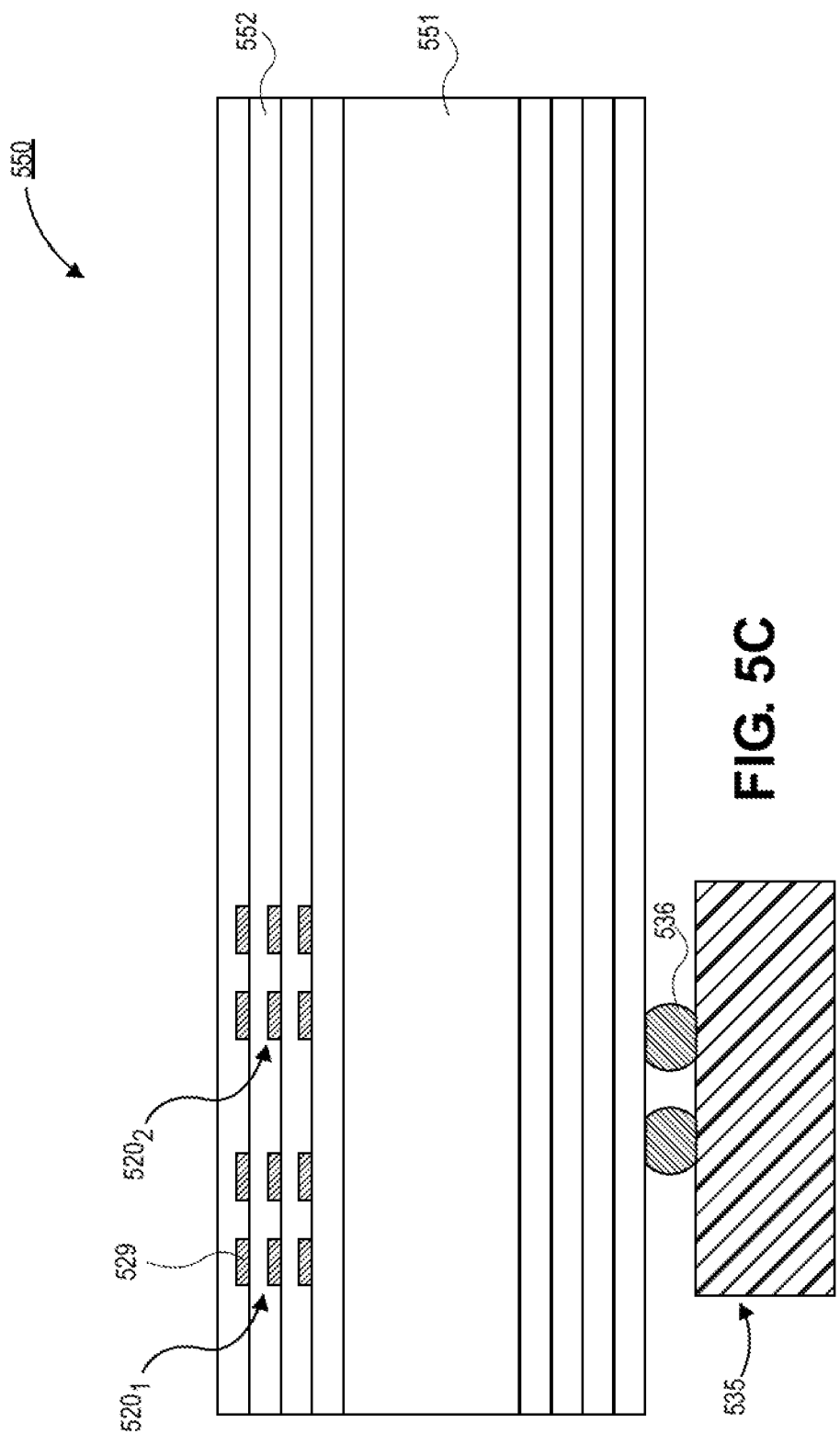

MULTI-PHASE SWITCHING REGULATORS WITH HYBRID INDUCTORS AND PER PHASE FREQUENCY CONTROL

TECHNICAL FIELD

Embodiments of the present disclosure relate to semiconductor devices, and more particularly to hybrid inductor arrays with per phase frequency control for voltage regulators.

BACKGROUND

Providing efficient and improved power delivery solutions is an ever growing design parameter for the electronics industry. Achieving high efficiency for multiphase integrated switching regulators requires high inductance per phase. This allows for reduced switching frequency and constant losses. However, the high inductance and reduced switching frequency results in degraded transient response.

One way to improve transient response performance is to use hybrid inductor arrays. In a hybrid inductor array, some fraction of the inductors are designed with a low inductance. These low inductance inductors are then engaged only when in power states that do not require high energy efficiency, such as during a turbo mode. However, the optimal switching frequency for the large inductors will be substantially lower than the optimal switching frequency for the small inductors. As such, the smaller inductors are switched at a non-optimal frequency. This results in a high ripple, and degraded efficiency and performance.

BRIEF DESCRIPTION OF THE DRAWINGS

FIG. 5C is a cross-sectional illustration of an electronic package that comprises a hybrid array of inductors that includes ACIs and discrete inductors attached to the electronic package, in accordance with an embodiment.

EMBODIMENTS OF THE PRESENT DISCLOSURE

Figure 1A:
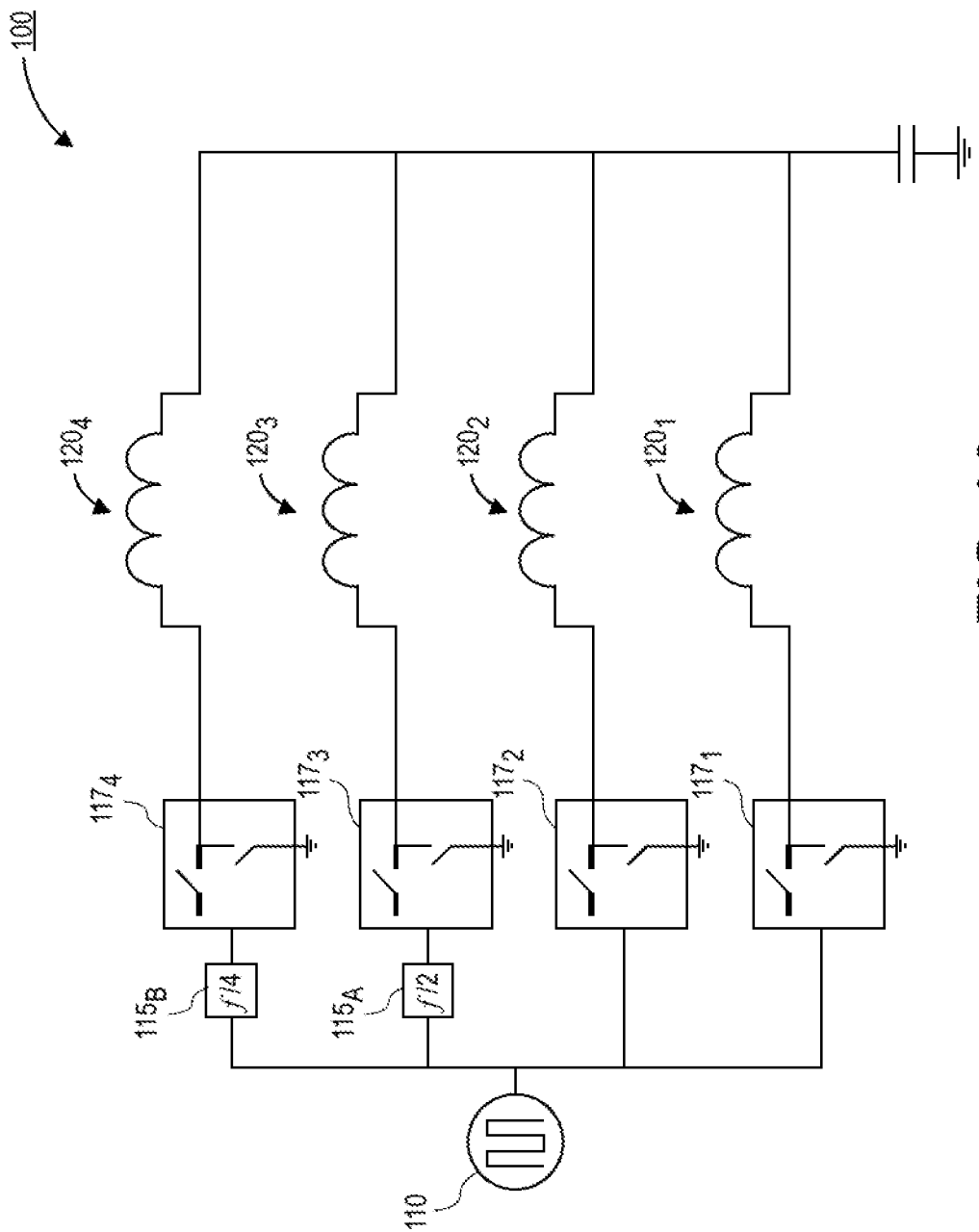
FIG. 1A is a schematic of a multiphase voltage regulator that comprises a hybrid array of inductors with a per phase frequency control that uses frequency dividers, in accordance with an embodiment.

Described herein are hybrid inductor arrays with per phase frequency control for voltage regulators, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, inductors with high inductance values allow for reduced switching frequencies and improved efficiencies due to lower losses. However, the high inductance and reduced switching frequency causes problems with the transient response. Particularly, the transient response is limited by the inductance and input/out voltage which sets the maximum di/dt of the integrated voltage regulator (IVR) current. High inductance arrays are slower to respond to transient requirements, and the increased droop on load step events must be guard banded by the addition of voltage margin. This increases power and reduces reliability margins.

IVRs, such as fully integrated voltage regulators (FIVR), typically use a multiphase topology. Such topologies use phase shedding to drop active phases to conserve energy in low power states. Thus, an efficient mode of operation would be to use hybrid inductor arrays that include phases with high inductance inductors and phases with low inductance inductors. In such topologies, the high inductance inductors may switch on for some fraction of the phases in low power states, and low inductance inductors are incrementally engaged when transitioning to higher power states where efficiency is not critical. The low inductance inductors, while less efficient, provide improved transient response (e.g., during a turbo mode). Additionally, the small inductors have an optimal switching frequency that is higher than the optimal switching frequency of the large inductors. Since the frequency driving each of the phases is uniform (and tuned to the optimal frequency of the large inductors), there is a high ripple current in the small inductors. As such, efficiency is significantly degraded in the voltage regulator.

Accordingly, embodiments disclosed herein include a voltage regulator with a hybrid inductor array that implements a per phase frequency control. As used herein, a "hybrid inductor array" may refer to an array of inductors where the inductors have a non-uniform inductance. In a hybrid inductor array two or more inductors may share substantially the same inductance, so long as there are at least two inductors in the array that have a different inductance. In some embodiments, a "hybrid inductor array" may also refer to an array of inductors that includes different inductor architectures. For example, a hybrid inductor array may include an air core inductor (ACI) and a magnetic core inductor (MCI). In yet another additional embodiment, a "hybrid inductor array" may refer to a first inductor that is integrated into a package substrate and a second inductor that is a discrete component that is attached to the package substrate. As used herein, "per phase frequency control" may refer to an architecture that allows for individual phases within a voltage domain to be switched at different frequencies. As such, the switching frequency can be tuned to the optimal switching frequency based on, at least in part, the inductance of a given phase within the domain.

In an embodiment, the frequency from a single frequency generator (e.g., a clock) may be modified by a frequency multiplier and/or a frequency divider before reaching an inductor in the domain. In such embodiments, the frequencies provided in the domain may be integer multiples (i.e., harmonics) or integer divisors (i.e., sub-harmonics) of each other. However, it is to be appreciated that the different switching frequencies within a domain may also be non-harmonic frequencies.

As those skilled in the art will recognize, the practice of different embodiments disclosed herein may be readily identified by various investigatory operations. In one instance, the presence of a hybrid array of inductors within a single voltage domain may be an indication that embodiments disclosed herein have been utilized. Additionally, analysis of the voltage control circuitry block may indicate that frequency multipliers and/or frequency dividers are provided between the frequency generator and one or more of the inductors. Furthermore, oscilloscope or spectrum analyzer measurements can be used to determine that multiple unique switching frequencies are applied to each phase in a voltage domain.

Referring now to FIG. 1A, a schematic illustration of a domain 100 is shown, in accordance with an embodiment. In the illustrated embodiment, the domain 100 comprises four phases that are switched on and off by power trains (PTRs) 117$_{1-4}$. While four phases are shown, it is to be appreciated that the domain 100 may comprise two or more phases. In a particular embodiment, the domain 100 may comprise eight or sixteen phases. The PTRs 117$_{1-4}$ may be switched on and off to enable phase shedding or phase addition in the domain 100, depending on the power needs of a computing die. The PTRs 117$_{1-4}$ may be controlled by a VR circuitry block (not shown) that is provided on the die. The PTRs 117$_{1-4}$ may also be provided on the die.

In an embodiment, each phase may include an inductor 120. The inductors 120$_{1-4}$ may be a hybrid array of inductors 120. That is, in some embodiments, the inductors 120$_{1-4}$ may comprise non-uniform inductances. For example, the first inductor 120$_1$ and the second inductor 120$_2$ may have a first inductance, the third inductor 120$_3$ may have a second inductance, and the fourth inductor 120$_4$ may have a third inductance. In a particular embodiment, the first inductor 120$_1$ and the second inductor 120$_2$ may have an inductance of 1.5 nH, the third inductor 120$_3$ may have an inductance of 3.0 nH, and the fourth inductor 120$_4$ may have an inductance of 6.0 nH. While the example values of the inductances are integer multiples of each other, it is to be appreciated that embodiments are not limited to such embodiments.

In an embodiment, the inductors 120$_{1-4}$ are embedded in a package substrate (not shown). The inductors 120$_{1-4}$ may all have the same architecture. For example, all of the inductors 120$_{1-4}$ may be coaxial magnetic inductors, such as coaxial metal inductor loop (coax MIL) architectures. In other embodiments, the inductors 120$_{1-4}$ may comprise different architectures. For example, the first inductor 120$_1$ and the second inductor 120$_2$ may be air core inductors (ACIs), and the third inductor 120$_3$ and the fourth inductor 120$_4$ may be coax MIL inductors. In yet another embodiment, one or more of the inductors 120$_{1-4}$ may be integrated in the package substrate, and one or more of the inductors 120$_{1-4}$ may be discrete components attached to or embedded in the package substrate.

In an embodiment, a frequency generator 110 is provided. The frequency generator 110 may be an oscillator such as a clock generator or the like. In an embodiment, the frequency generator 110 may be electrically coupled to each of the PTRs 117$_{1-4}$. Control circuits (not shown) determine the duty cycle for how long each switch in the PTR is turned on or off. The control circuits may be linear controllers (e.g., Type II or Type III analog controllers), digital controllers, or a non-linear controller that implements hysteretic control. As shown, one or more frequency dividers 115 may be provided between the frequency generator 110 and one of the PTRs 117. Particularly, a first frequency divider 115$_A$ is provided between the frequency generator 110 and the third PTR 117$_3$, and a second frequency divider 115$_B$ is provided between the frequency generator 110 and the fourth PTR 117$_4$. In an embodiment, the first frequency divider 115$_A$ divides the frequency from the frequency generator 110 in half, and the second frequency divider 115$_B$ divides the frequency from the frequency generator by four. The first PTR 117$_1$ and the second PTR 117$_2$ may be provided with the frequency generated by the frequency generator 110.

In an embodiment, the frequency dividers 115 allow for per phase frequency control. That is, the frequency provided to the individual inductors 120 in each phase may be particularly tuned to provided improved efficiencies. For example, inductors 120 with a high inductance may be supplied with a lower frequency switching signal, and inductors 120 with a low inductance may be supplied with a higher frequency switching signal. In a particular embodiment, where inductors 120$_1$ and 120$_2$ have low inductance values (e.g., 1.5 nH), inductor 120$_3$ has an intermediate inductance value (e.g., 3.0 nH), and inductor 120$_4$ has the highest inductance value (e.g., 6.0 nH), the inductors 120$_1$ and 120$_2$ are supplied with the highest frequency switching signal (i.e., f), the inductor 120$_3$ is supplied with an intermediate frequency (i.e., f/2), and the inductor 120$_4$ is supplied with the lowest frequency (i.e., f/4). In an embodiment, the frequency f may be 140 MHz, which results in the frequency f/2 being 70 MHz, and the frequency f/4 being 35 MHz. Typically, optimization of the switching frequency would require circuit simulations, and the optimal values need not be sub-harmonics of the highest switching frequency. That is, the embodiment described above that utilizes sub-harmonics is only exemplary in nature.

Figure 1B:
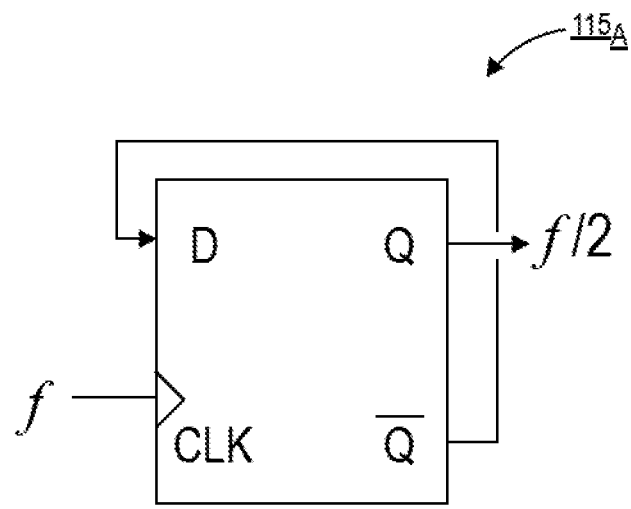
FIG. 1B is a schematic of a D flip-flop frequency divider that may be used as the frequency divider in FIG. 1A, in accordance with an embodiment.
Figure 1C:
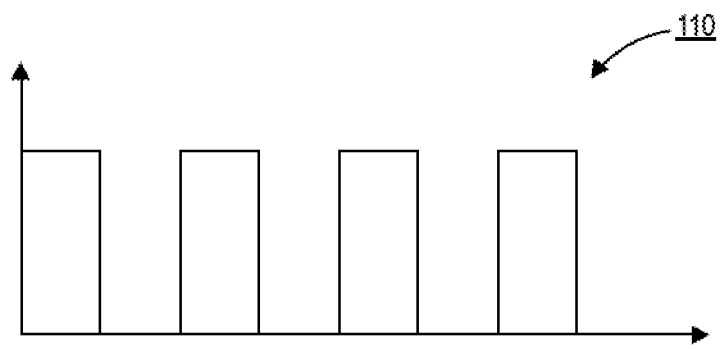
FIG. 1C is a chart of the input frequency and the output frequency of a D flip-flop frequency divider, in accordance with an embodiment.
Figure 1C:
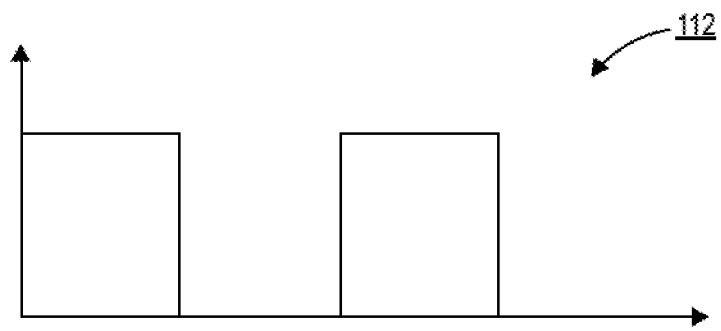

Referring now to FIG. 1B, an example of a suitable frequency divider $115_A$ is shown, in accordance with an embodiment. As shown, the frequency divider $115_A$ takes f as an input value and outputs f/2. In the particular embodiment shown in FIG. 1B, the frequency divider $115_A$ is a D flip-flop based frequency divider $115_A$. As shown, the inverted output terminal $\overline{Q}$ (NOT-Q) is connected directly back to the Data input terminal D giving the device "feedback". It can be seen from the frequency waveforms from the frequency generator 110 (input frequency) and 112 (output frequency) in FIG. 1C, that by "feeding back" the output from $\overline{Q}$ to the input terminal D, the output pulses at Q have a frequency that are exactly one half (f/2) that of the input clock frequency f. In other words the circuit produces frequency division as the D flip-flop divides the input frequency f by a factor of two.

The frequency divider $115_A$ is one example of an implementation of a frequency divider that may be used in accordance with embodiments disclosed herein. It is to be appreciated that other frequency division circuits may be used, as those skilled in the art will appreciate. Additionally, a first D flip-flop circuit may be in series with a second D flip-flop circuit in order to provide a division of the frequency f by four. Such an embodiment may be useful for providing the frequency divider $115_B$ shown in FIG. 1A.

Figure 2A:
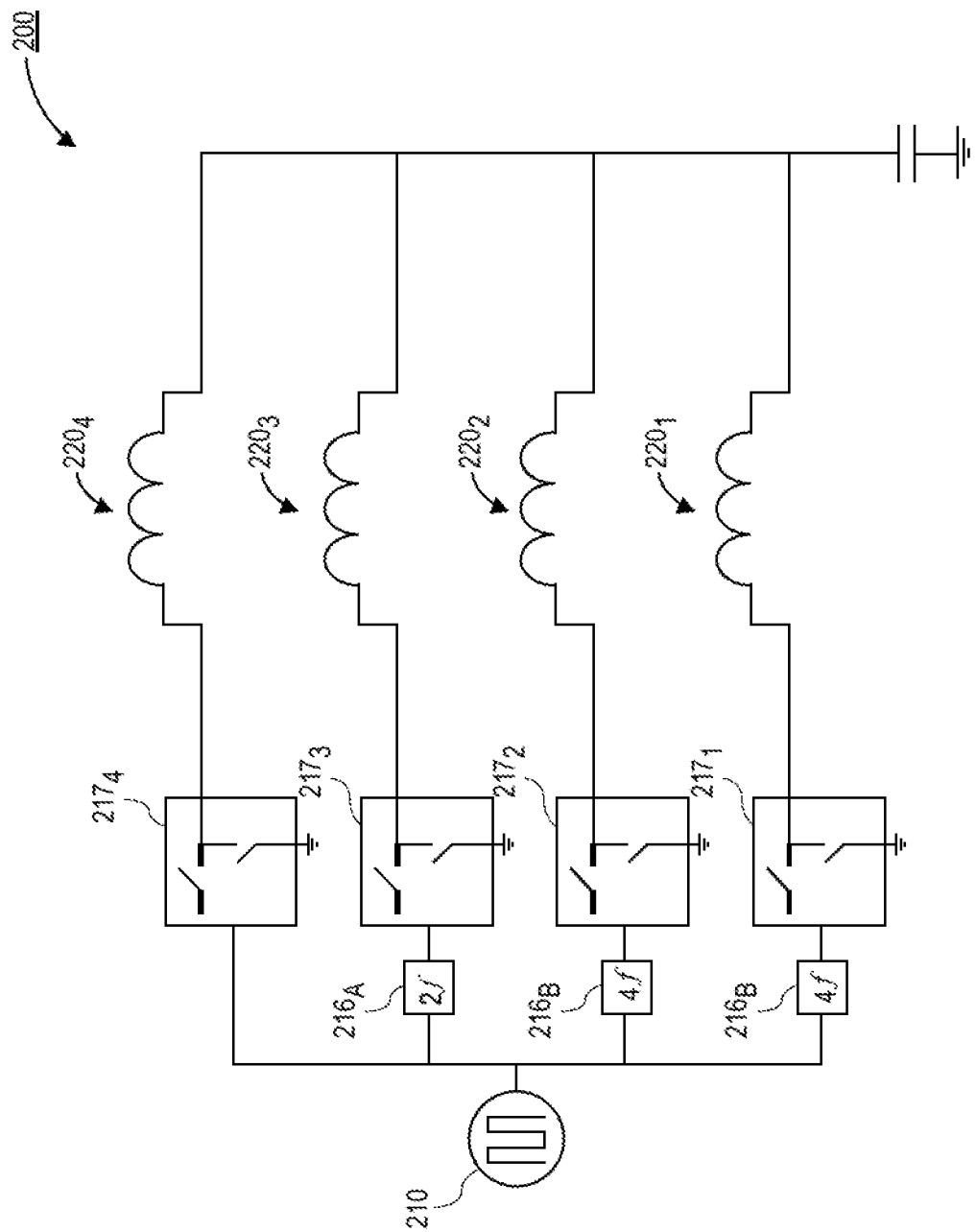
FIG. 2A is a schematic of a multiphase voltage regulator that comprises a hybrid array of inductors with a per phase frequency control that uses frequency multipliers, in accordance with an embodiment.

Referring now to FIG. 2A, a schematic illustration of a domain 200 is shown, in accordance with an embodiment. In an embodiment, the domain 200 includes four phases, with each phase being controlled by a PTR $217_{1-4}$. While four phases are shown, it is to be appreciated that the domain 200 may comprise two or more phases. In a particular embodiment, the domain 200 may comprise eight or sixteen phases. The PTRs $217_{1-4}$ may be switched on and off to enable phase shedding or phase addition in the domain 200, depending on the power needs of a computing die. The PTRs $217_{1-4}$ may be controlled by a VR circuitry block (not shown) that is provided on the die. The PTRs $217_{1-4}$ may also be provided on the die.

In an embodiment, each phase may include an inductor $220_{1-4}$. The inductors $220_{1-4}$ may be considered a hybrid array of inductors. That is, the inductances of the inductors $220_{1-4}$ may be non-uniform. For example, the inductors $220_1$ and $220_2$ may have an inductance of 1.5 nH, the inductor $220_3$ may have an inductance of 3.0 nH, and the inductor $220_4$ may have an inductance of 6 nH. Due to the different inductances, the optimal switching frequency of each of the phases may also be non-uniform. Accordingly, per phase frequency control may be provided to convert the input frequency generated by the frequency generator 210 to the optimum frequency for each of the phases.

In contrast to the embodiment described above with respect to FIGS. 1A-1C, the per phase frequency control may be implemented using frequency multiplication. That is, the frequency generator 210 may have a frequency set to the lowest optimal frequency (i.e., the optimal switching frequency for the inductor $220_4$), and frequency multipliers $216_A$ and $216_B$ are used to multiply the input frequency to provide the optimal frequency for the remaining inductors 220. For example, a two-times frequency multiplier $216_A$ is provided for the inductor $220_3$, and a four-times frequency multiplier $216_B$ is provided for the inductors $220_2$ and $220_1$.

In an embodiment, the frequency f generated by the frequency generator 210 may be 35 MHz, which results in the frequency 2f being 70 MHz, and the frequency 4f being 140 MHz. Typically, optimization of the switching frequency would require circuit simulations, and the optimal values need not be harmonics of the lowest switching frequency. That is, the embodiment described above that utilizes harmonics is only exemplary in nature.

Figure 2B:
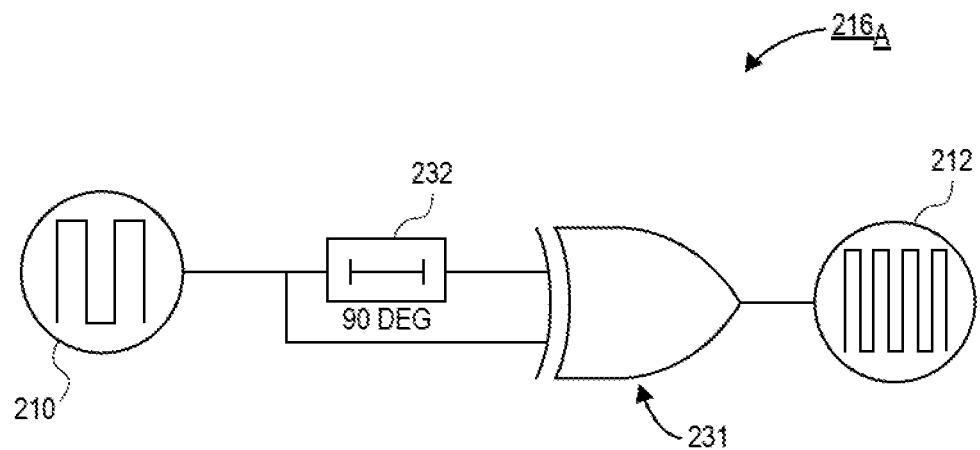
FIG. 2B is a schematic of frequency multiplier with a 90 degree phase delay and an XOR gate, in accordance with an embodiment.
Figure 2C:
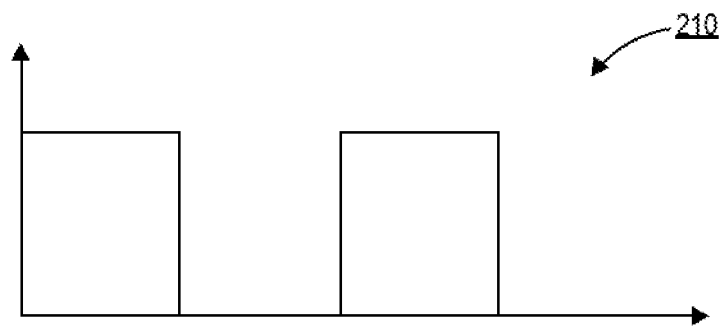
FIG. 2C is a chart of the input frequency and the output frequency of the frequency multiplier in FIG. 2B, in accordance with an embodiment.
Figure 2C:
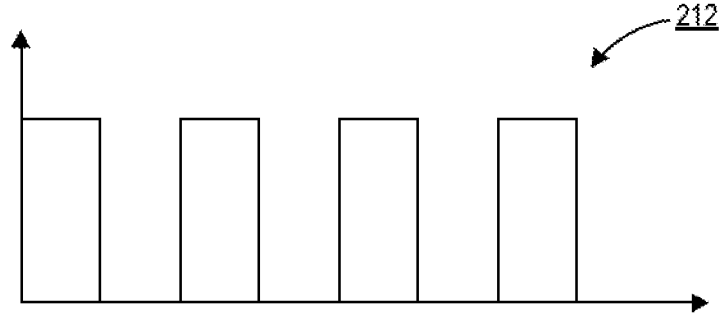

Referring now to FIG. 2B, an example of a frequency multiplier $216_A$ is shown, in accordance with an embodiment. As shown, the frequency multiplier $216_A$ comprises an XOR gate 231. A first input to the XOR gate 231 is the frequency f from the frequency generator 210, and a second input to the XOR gate 231 is the frequency f with a delay 232. In a particular embodiment, the delay 232 may be a 90 degree delay. The output frequency 212 is therefore, twice the input frequency f. This is clearly shown in the frequency wave forms of the input frequency from the frequency generator 210 and the output frequency 212 in FIG. 2C.

In an embodiment, multiple frequency multipliers $216_A$ may be linked together in series in order to provide further multiplication of the original input frequency f from the frequency generator 210. For example, two instances of the frequency multiplier $216_A$ in series will generate an output frequency that is 4f that is suitable for the use of the frequency multiplier $216_B$. Additionally, the frequency multiplier $216_A$ is one example of an implementation of a frequency multiplier that may be used in accordance with embodiments disclosed herein. It is to be appreciated that other frequency multiplier circuits may be used, as those skilled in the art will appreciate.

Figure 3:
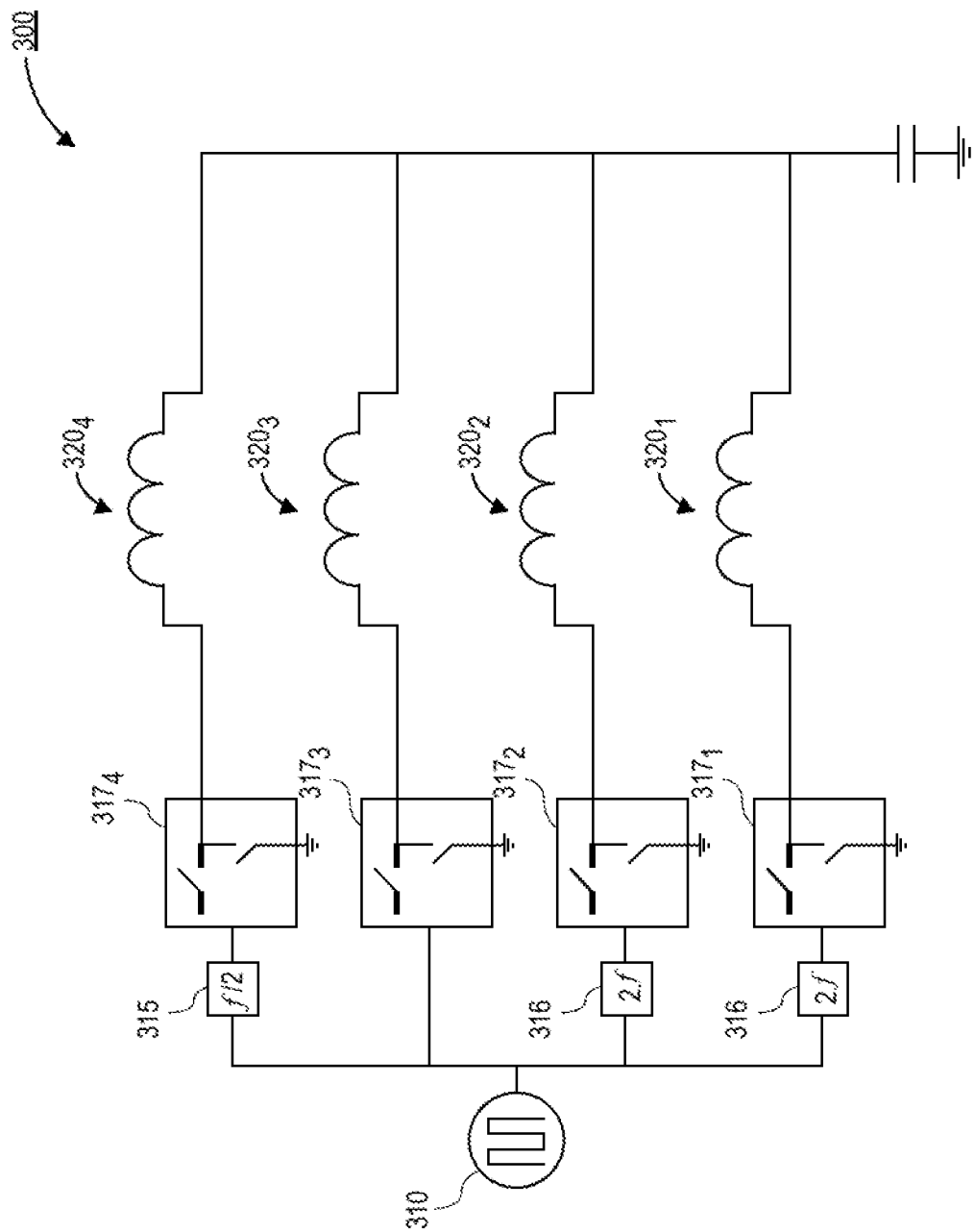
FIG. 3 is a schematic of a multiphase voltage regulator that comprises a hybrid array of inductors with a per phase frequency control that uses frequency dividers and frequency multipliers, in accordance with an embodiment.

Referring now to FIG. 3, a schematic illustration of a domain 300 is shown, in accordance with an embodiment. In an embodiment, the domain 300 includes four phases, with each phase being controlled by a PTR $317_{1-4}$. While four phases are shown, it is to be appreciated that the domain 300 may comprise two or more phases. In a particular embodiment, the domain 300 may comprise eight or sixteen phases. The PTRs $317_{1-4}$ may be switched on and off to enable phase shedding or phase addition in the domain 300, depending on the power needs of a computing die. The PTRs $317_{1-4}$ may be controlled by a VR circuitry block (not shown) that is provided on the die. The PTRs $317_{1-4}$ may also be provided on the die.

In an embodiment, each phase may include an inductor $320_{1-4}$. The inductors $320_{1-4}$ may be considered a hybrid array of inductors. That is, the inductances of the inductors $320_{1-4}$ may be non-uniform. For example, the inductors $320_1$ and $320_2$ may have an inductance of 1.5 nH, the inductor $320_3$ may have an inductance of 3.0 nH, and the inductor $320_4$ may have an inductance of 6 nH. Due to the different inductances, the optimal switching frequency of each of the phases may also be non-uniform. Accordingly, per phase frequency control may be provided to convert the input frequency generated by the frequency generator 310 to the optimum frequency for each of the phases.

In an embodiment, the frequency generator 310 of the domain 300 may be set to provide an intermediate frequency f. For example, the frequency f may be optimized for the phase with the third inductor $320_3$. As such, the frequency f needs to be reduced to optimize the fourth inductor $320_4$ and multiplied to optimize the first inductor $320_1$ and the second inductor $320_2$. Accordingly, embodiments disclosed herein include domains 300 that include both a frequency divider 315 and a frequency multiplier 316.

In an embodiment, the frequency divider 315 may be substantially similar to the frequency dividers 115 described above with respect to FIGS. 1A-1C. For example, the frequency divider 315 may comprise a D flip-flop circuit. In an embodiment, the frequency multipliers 316 may be substantially similar to the frequency multipliers 216 described above with respect to FIGS. 2A-2C. For example, the frequency multipliers 316 may include an XOR gate with the frequency f as the first input and a frequency f that is delayed by 90 degrees as the second input.

Figure 4:
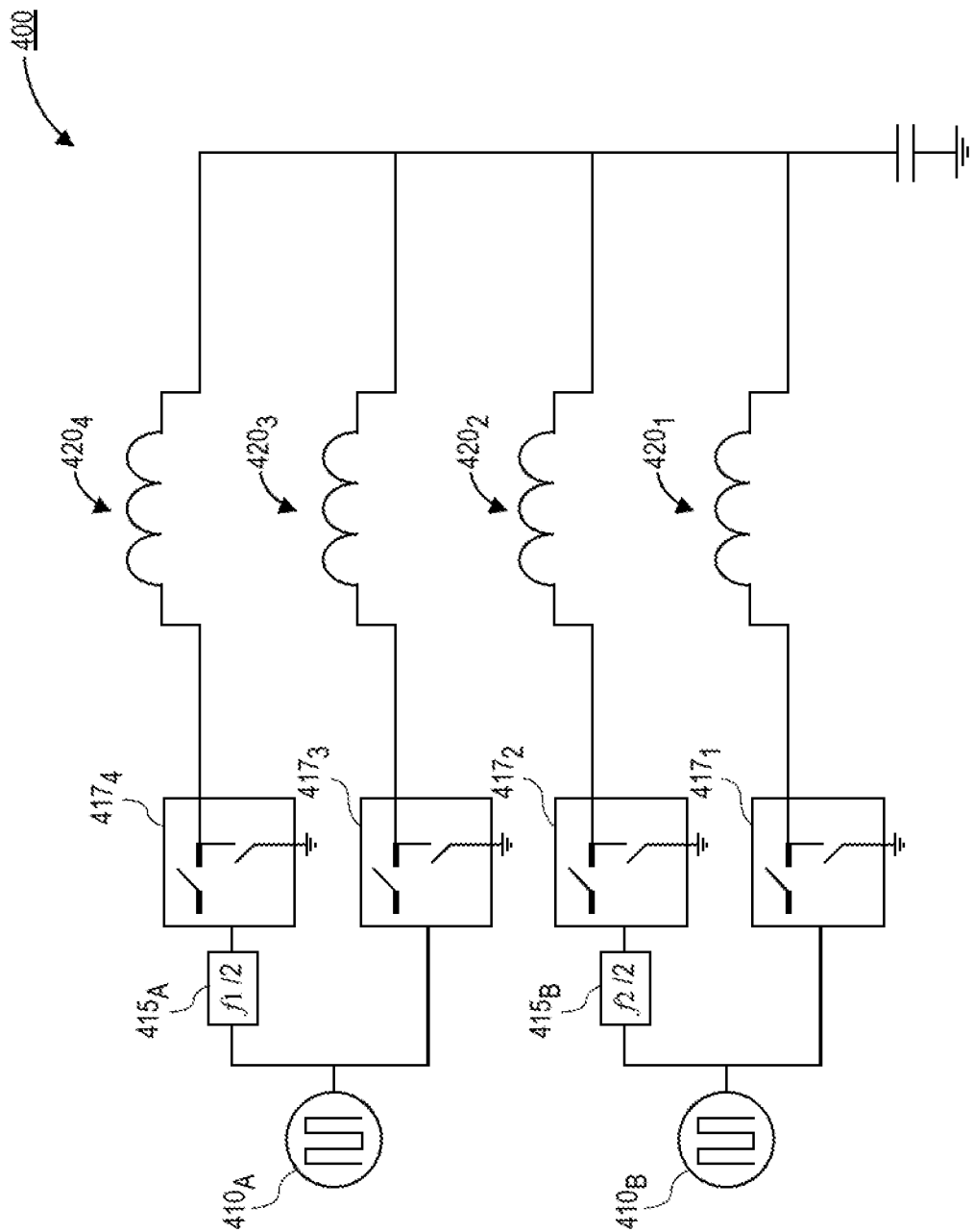
FIG. 4 is a schematic of a multiphase voltage regulator that comprises a hybrid array of inductors with a per phase frequency control that uses a plurality of clocks, in accordance with an embodiment.

Referring now to FIG. 4, a schematic illustration of a domain 400 is shown, in accordance with an embodiment. In an embodiment, the domain 400 includes four phases, with each phase being controlled by a PTR $417_{1-4}$. While four phases are shown, it is to be appreciated that the domain 400 may comprise two or more phases. In a particular embodiment, the domain 400 may comprise eight or sixteen phases. The PTRs $417_{1-4}$ may be switched on and off to enable phase shedding or phase addition in the domain 300, depending on the power needs of a computing die. The PTRs $417_{1-4}$ may be controlled by a VR circuitry block (not shown) that is provided on the die. The PTRs $417_{1-4}$ may also be provided on the die.

In an embodiment, the phases may be separated into a first group and a second group, with each group having its own frequency generator 410. For example, frequency generator $410_A$ provides a first input frequency to the phases comprising the third inductor $420_3$ and the fourth inductor $420_4$, and the frequency generator $410_B$ provides a second input frequency to the phases comprising the first inductor $420_1$ and the second inductor $420_2$. In an embodiment, the frequency of the first frequency generator $410_A$ is different than the frequency of the second frequency generator $410_B$.

In the first group of phases, the frequency supplied by the first frequency generator $410_A$ may be tuned to optimize the third inductor $420_3$. The fourth inductor $420_4$ may be optimized by a frequency that is one-half that of the frequency supplied by the first frequency generator $410_A$. As such, a frequency divider $415_A$ may be provided between the first frequency generator $410_A$ and the PTR $417_4$. In an embodiment, the frequency divider $415_A$ may be substantially similar to the frequency divider 115 described above with respect to FIGS. 1A-1C. Alternatively, the first frequency generator $410_A$ may be tuned to provide the optimal frequency to the fourth inductor $420_4$, and a frequency multiplier (not shown) may be provided between the first frequency generator $410_A$ and the third PTR $417_3$. In an embodiment, frequency multipliers similar to the frequency multiplier 216 in FIGS. 2A-2C may be used.

Similarly, in the second group of phases, the frequency supplied by the second frequency generator $410_B$ may be tuned to optimize the first inductor $420_1$. The second inductor $420_2$ may be optimized by a frequency that is one-half that of the frequency supplied by the second frequency generator $410_B$. As such, a frequency divider $415_B$ may be provided between the second frequency generator $410_B$ and the PTR $417_2$. In an embodiment, the frequency divider $415_B$ may be substantially similar to the frequency divider 115 described above with respect to FIGS. 1A-1C. Alternatively, the second frequency generator $410_B$ may be tuned to provide the optimal frequency to the second inductor $420_2$, and a frequency multiplier (not shown) may be provided between the second frequency generator $410_B$ and the first PTR $417_1$. In an embodiment, frequency multipliers similar to the frequency multiplier 216 in FIGS. 2A-2C may be used.

Figure 5A:
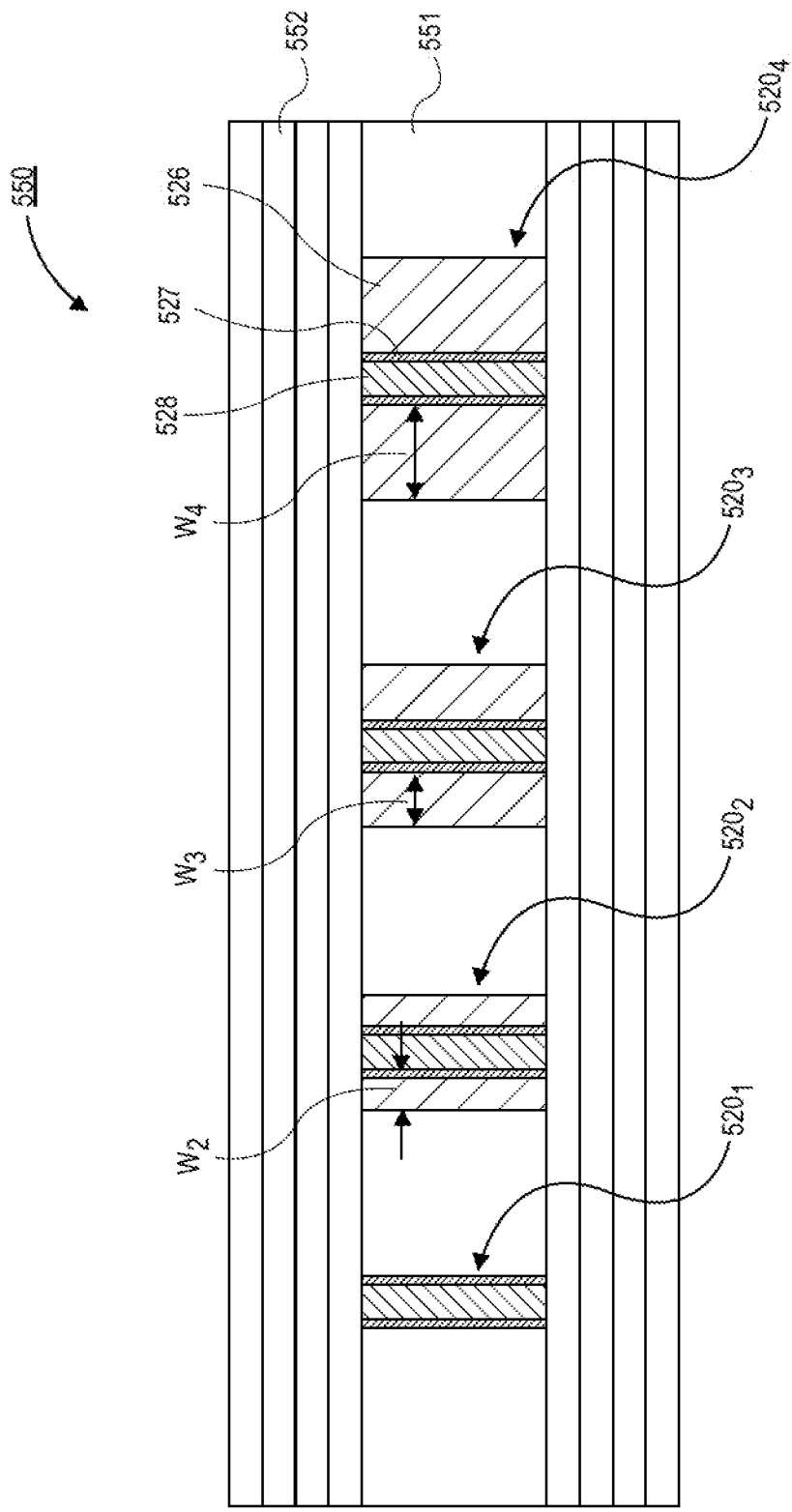
FIG. 5A is a cross-sectional illustration of an electronic package that comprises an array of inductors in a single voltage domain, where the array of inductors have a non-uniform inductance, in accordance with an embodiment.

Referring now to FIG. 5A, a cross-sectional illustration of a package substrate 550 is shown, in accordance with an embodiment. In an embodiment, the package substrate 550 may comprise a core 551. The core 551 may comprise fiber reinforced insulating materials common of core fabrication. In an embodiment, a plurality of dielectric layers 552 may be provided over top and bottom surfaces of the core 551. Conductive features (e.g., traces, pads, vias, etc.) (not shown) may be embedded in or disposed on the dielectric layers 552 to provide conductive routing within the package substrate 550.

In an embodiment, an array of inductors $520_{1-4}$ may be embedded in the core 551 of the package substrate 550. The inductors $520_{1-4}$ may each be an inductor for a different phase within a single domain. In an embodiment, the inductors 520 may be coax MIL inductors. The inductors $520_{2-4}$ may each comprise a plated through hole 527 that is surrounded by a magnetic shell 526. The first inductor $520_1$ may simply comprise a plated through hole 527 without a magnetic shell 526. In an embodiment, the plated through holes 527 may be plugged with an insulative material 528. In the illustrated embodiment, a single portion of each inductor loop is provided for simplicity. However, it is to be appreciated that coax MIL inductors may comprise a first portion (visible in FIG. 5A) through the core 551 that is electrically coupled to a second portion (out of the plane of FIG. 5A) that is substantially similar to the first portion.

In a particular embodiment, the inductors $520_{1-4}$ may have non-uniform inductances. For example, the first inductor $520_1$ (without a magnetic shell) has the smallest inductance, and the fourth inductor $520_4$ has the largest inductance. The second inductor $520_2$ and the third inductor $520_3$ have intermediate inductances. The inductance is dependent in part on the width W of the magnetic shells 526. For example, the fourth width $W_4$ of the fourth inductor $520_4$ is larger than the third width $W_3$ of the third inductor $520_3$, and the third width $W_3$ is larger than the second width $W_2$ of the second inductor $520_2$.

In an embodiment, each of the inductors $520_{1-4}$ may be switched at different switching frequencies in order to provide per phase frequency control. The necessary input frequencies may be supplied using frequency multipliers and/or frequency dividers substantially similar to embodiments described above.

Figure 5B:
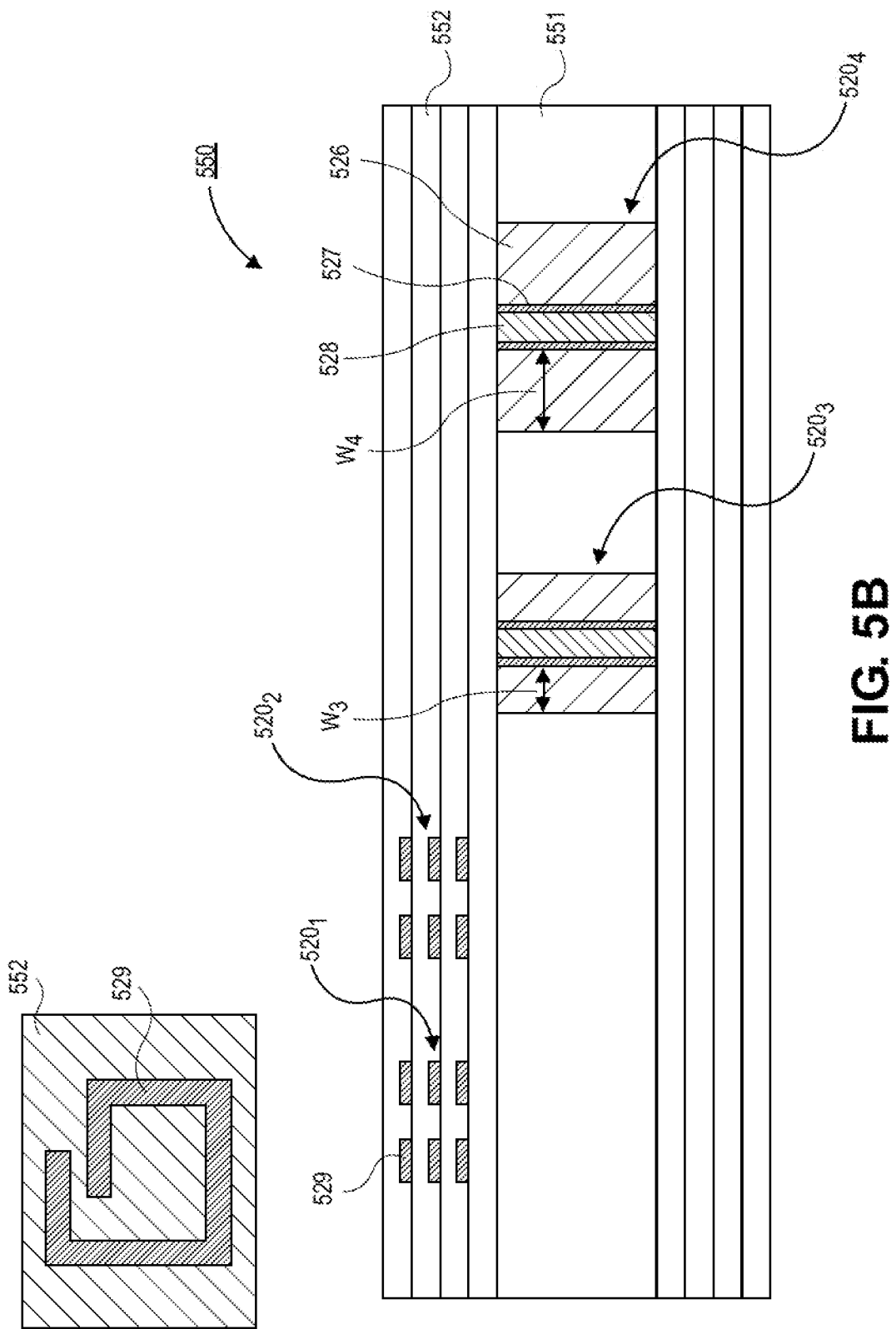
FIG. 5B is a cross-sectional illustration of an electronic package that comprises a hybrid array of inductors that includes air core inductors (ACIs) and coaxial magnetic integrated inductors (Coax MIL) inductors with non-uniform inductances, in accordance with an embodiment.

Referring now to FIG. 5B, a cross-sectional illustration of a package substrate 550 is shown, in accordance with an additional embodiment. In an embodiment, the inductor array comprises a first inductor $520_1$ and a second inductor $520_2$ that have different architectures than the third inductor $520_3$ and the fourth inductor $520_4$. For example, the first inductor $520_1$ and the second inductor $520_2$ may be air core inductors. As shown in the plan view above, the trace 529 may form a conductive loop to provide the inductance. The loop may be filled with the dielectric layer 552, or the core may be left as air. In an embodiment, the first inductor $520_1$ and the second inductor $520_2$ may be embedded in the dielectric layers 552 over the core 551. In an embodiment, the third inductor $520_3$ and the fourth inductor $520_4$ may be coax MTh inductors, similar to those described above with respect to FIG. 5A. For example, an inductance of third inductor $520_3$ and the fourth inductor $520_4$ may be, at least partially, dependent on the width $W_3$ and $W_4$ of the magnetic shells 526.

Despite having different architectures, the inductors $520_{1-4}$ may be part of a single domain, with each inductor $520_{1-4}$ representing a different phase of the domain. In an embodiment, the inductors $520_{1-4}$ may be switched at different switching frequencies in order to provide per phase frequency control. The necessary input frequencies may be supplied using frequency multipliers and/or frequency dividers substantially similar to embodiments described above.

Referring now to FIG. 5C, a cross-sectional illustration of a package substrate 550 is shown, in accordance with an additional embodiment. As shown, the array of inductors may comprise air core inductors $520_1$ and $520_2$, and a discrete inductor module 535. The discrete inductor module 535 may comprise one or more different inductors. The discrete inductor module 535 may be connected to the package substrate 550 by interconnects 536, such as solder balls. In other embodiments, the inductor module 535 may be embedded in the dielectric layers 552 and/or the core 551.

Despite having different architectures, the inductors $520_{1-2}$ and the discrete inductor module 535 may be part of a single domain, with each inductor $520_{1-2}$ and discrete inductor module 535 representing a different phase of the domain. In an embodiment, the inductors 520/535 may be switched at different switching frequencies in order to provide per phase frequency control. The necessary input frequencies may be supplied using frequency multipliers and/or frequency dividers substantially similar to embodiments described above.

Figure 6:
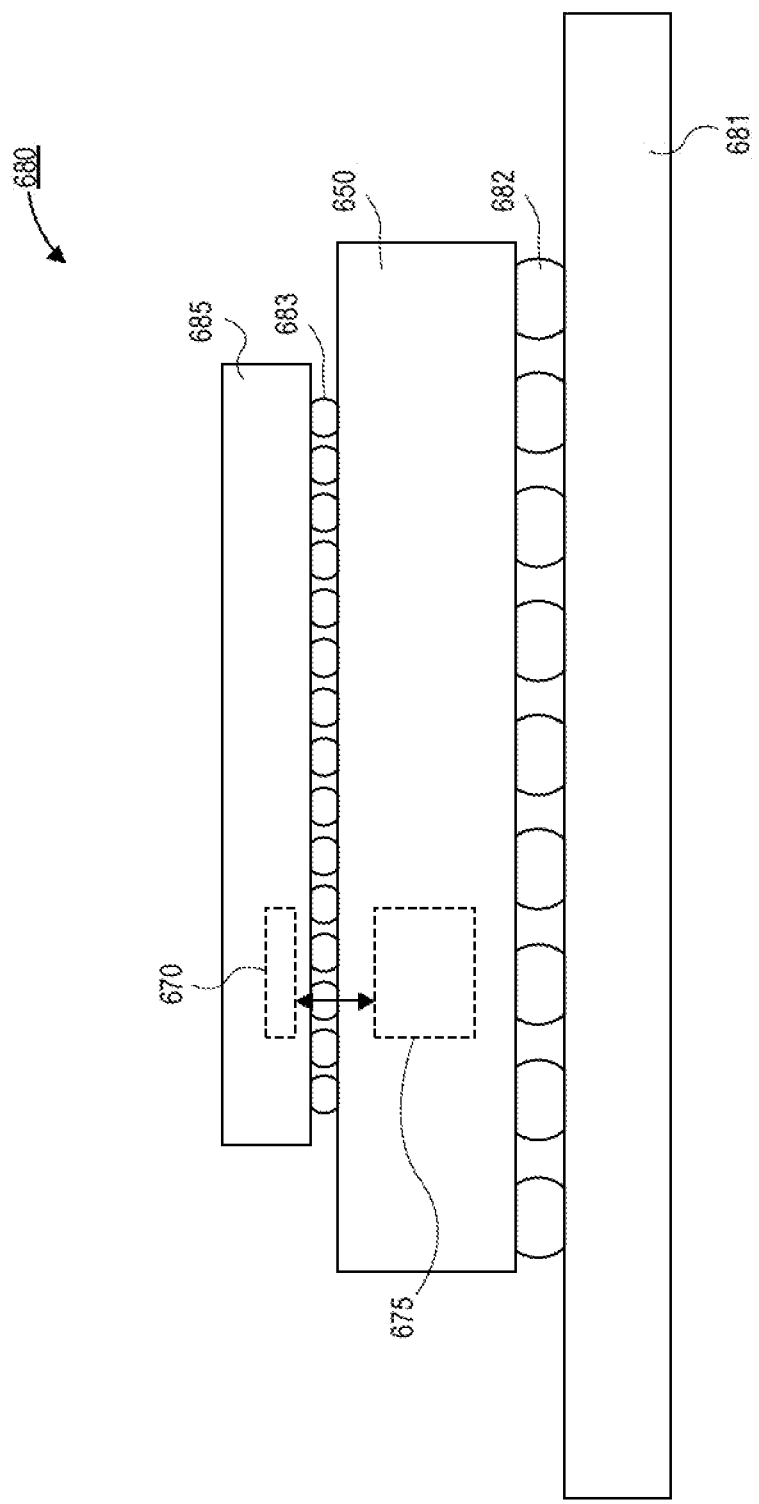
FIG. 6 is a cross-sectional schematic of an electronic system that comprises a package substrate with embedded inductors and a die with a voltage regulator circuitry block.

Referring now to FIG. 6, a cross-sectional illustration of an electronic system 680 is shown, in accordance with an embodiment. The electronic system 680 may comprise a board 681, such as a printed circuit board (PCB) or the like. In an embodiment, a package substrate 650 is electrically coupled to the board 681 by interconnects 682. The interconnects 682 are shown as being solder balls, but it is to be appreciated that interconnects 682 may comprise any suitable interconnect architecture, such as sockets or the like. In an embodiment, a die 685 is electrically coupled to the package substrate 650 by interconnects 683. The interconnects 683 may be any suitable first level interconnect (FLI) architecture.

In an embodiment, a hybrid array of inductors 675 may be provided on or in the package substrate 650. The hybrid array of inductors 675 may be electrically coupled to a voltage regulator (VR) circuitry block 670 provided on the die 685. The VR circuitry block 670 may comprise a frequency generator, control circuitry and power train blocks for the individual phases of the VR system, and one or more frequency multipliers and/or frequency dividers. The hybrid array of inductors 675 may have a plurality of inductors with each inductor providing a different phase in a voltage domain. In an embodiment, the VR circuitry block 670 is configured to provide per phase frequency control of the hybrid array of inductors 675.

Figure 7:
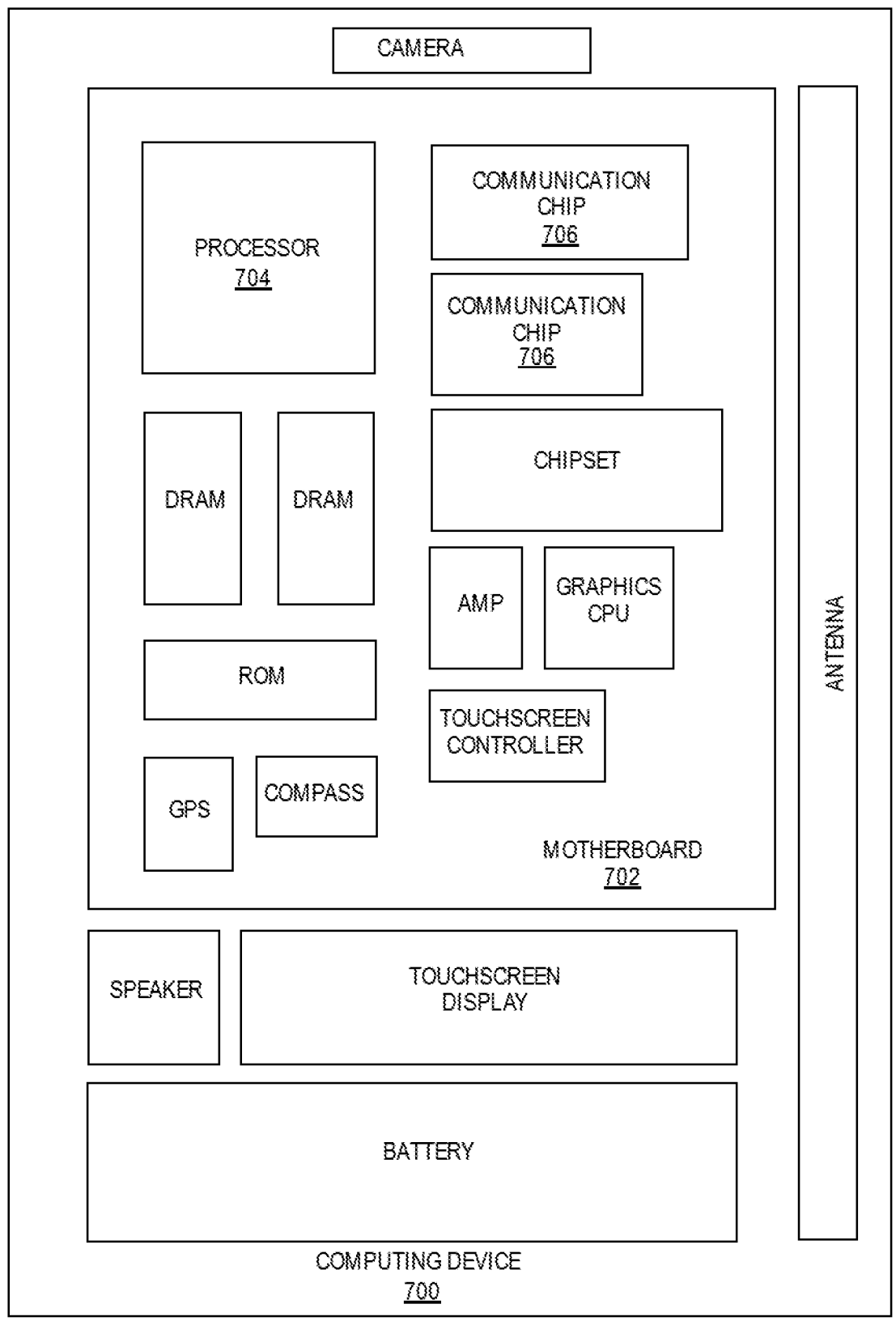
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations, the integrated circuit die of the processor may be coupled to an electronic package that comprises a hybrid inductor array that is enabled to provide per phase frequency control in order to enable improved VR efficiency, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be coupled to an electronic package that comprises a hybrid inductor array that is enabled to provide per phase frequency control in order to enable improved VR efficiency, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an inductor array, comprising: a first inductor with a first inductance, and wherein the first inductor is switched at a first frequency; and a second inductor with a second inductance that is different than the first inductance, and wherein the second inductor is switched at a second frequency that is different than the first frequency.

Example 2: the inductor array of Example 1, wherein the first inductor and the second inductor are within the same voltage domain.

Example 3: the inductor array of Example 1 or Example 2, wherein the first inductance is larger than the second inductance, and wherein the first frequency is lower than the second frequency.

Example 4: the inductor array of Example 3, wherein the second frequency is an integer multiple of the first frequency.

Example 5: the inductor array of Example 3, further comprising: a frequency divider coupled to the first inductor.

Example 6: the inductor array of Example 5, wherein the frequency divider is a D flip-flop based frequency divider.

Example 7: the inductor array of Example 3, further comprising: a frequency multiplier coupled to the second inductor.

Example 8: the inductor array of Example 7, wherein the frequency multiplier comprises a XOR logic gate with a first input being an input frequency and a second input being the input frequency delayed by ninety degrees.

Example 9: the inductor array of Examples 1-7, wherein the first inductor is an air core inductor and the second inductor is an air core inductor, and wherein the first inductance is larger than the second inductance.

Example 10: the inductor array of Examples 1-7, wherein the first inductor is a magnetic inductor, and the second inductor is an air core inductor, and wherein the first inductance is larger than the second inductance.

Example 11: the inductor array of Example 10, wherein the magnetic inductor is coaxial magnetic integrated inductor, a planar magnetic integrated inductor, or a discrete magnetic inductor.

Example 12: the inductor array of Examples 1-7, wherein the first inductor and the second inductor are magnetic inductors, and wherein the first inductance is larger than the second inductance.

Example 13: the inductor array of Examples 1-12, further comprising: a third inductor with a third inductance, wherein the third inductance is different than the first inductance and the second inductance, and wherein the third inductor is switched at a third frequency that is different than the first frequency and the second frequency; and a fourth inductor with the third inductance, and wherein the fourth inductor is switched at the third frequency.

Example 14: an integrated voltage regulator, comprising: a plurality of voltage domains, wherein individual ones of the plurality of voltage domains comprises: a plurality of inductors, wherein individual ones of the plurality of inductors are operated at different phases, and wherein individual ones of the plurality of inductors are switched at different frequencies.

Example 15: the integrated voltage regulator of Example 14, wherein a first inductor of the plurality of inductors has a first inductance, and wherein the first inductor is switched at a first frequency, and wherein a second inductor of the plurality of inductors has a second inductance that is larger than the first inductance, and wherein the second inductor is switched at a second frequency that is lower than the first frequency.

Example 16: the integrated voltage regulator of Example 15, wherein the first inductor is an air core inductor and the second inductor is an air core inductor.

Example 17: the integrated voltage regulator of Example 15, wherein the first inductor is an air core inductor and the second inductor is a magnetic inductor, and wherein the magnetic inductor comprises a coaxial magnetic integrated inductor, a planar magnetic integrated inductor, or a discrete inductor.

Example 18: the integrated voltage regulator of Example 15, wherein the first inductor is a magnetic inductor and the second inductor is a magnetic inductor.

Example 19: the integrated voltage regulator of Examples 15-19, further comprising: a frequency multiplier connected to the first inductor.

Example 20: the integrated voltage regulator of Examples 15-20, further comprising: a frequency divider connected to the second inductor.

Example 21: the integrated voltage regulator of Examples 14-18, wherein the integrated voltage regulator is a fully integrated voltage regulator (FIVR).

Example 22: an electronic system, comprising: a package substrate; a first inductor embedded in the package substrate, wherein the first inductor has a first inductance; a second inductor embedded in the package substrate, wherein the second inductor has a second inductance that is different than the first inductance; a die electrically coupled to the package substrate, wherein the die comprises: a voltage regulator circuitry block, wherein the voltage regulator circuitry block is electrically coupled to the first inductor and the second inductor, and wherein the voltage regulator circuitry block provides a first switching frequency to the first inductor and a second switching frequency that is different than the first switching frequency to the second inductor.

Example 23: the electronic system of Example 22, wherein the first inductor comprises: a plated through hole via; and a magnetic shell surrounding the plated through hole via, and wherein the second inductor comprises one or more conductive loops.

Example 24: the electronic system of Example 23, wherein the first inductance is larger than the second inductance, and wherein the first switching frequency is lower than the second switching frequency.

Example 25: the electronic system of Examples 22-24, further comprising: a board, wherein the package substrate is electrically coupled to the board.

What is claimed is:
1. An inductor array, comprising:
a first inductor with a first inductance, and wherein the first inductor is switched at a first frequency;
a second inductor with a second inductance that is different than the first inductance, and wherein the second inductor is switched at a second frequency that is different than the first frequency; and
a third inductor with a third inductance, wherein the third inductance is different than the first inductance and the second inductance, and wherein the third inductor is switched at a third frequency that is different than the first frequency and the second frequency.

2. The inductor array of claim 1, wherein the first inductor and the second inductor are within the same voltage domain.

3. The inductor array of claim 1, wherein the first inductance is larger than the second inductance, and wherein the first frequency is lower than the second frequency.

4. The inductor array of claim 3, wherein the second frequency is an integer multiple of the first frequency.

5. The inductor array of claim 3, further comprising:
a frequency divider coupled to the first inductor.

6. The inductor array of claim 5, wherein the frequency divider is a D flip-flop based frequency divider.

7. The inductor array of claim 3, further comprising:
a frequency multiplier coupled to the second inductor.

8. The inductor array of claim 7, wherein the frequency multiplier comprises a XOR logic gate with a first input being an input frequency and a second input being the input frequency delayed by ninety degrees.

9. The inductor array of claim 1, wherein the first inductor is an air core inductor and the second inductor is an air core inductor, and wherein the first inductance is larger than the second inductance.

10. The inductor array of claim 1, wherein the first inductor is a magnetic inductor, and the second inductor is an air core inductor, and wherein the first inductance is larger than the second inductance.

11. The inductor array of claim 10, wherein the magnetic inductor is coaxial magnetic integrated inductor, a planar magnetic integrated inductor, or a discrete magnetic inductor.

12. The inductor array of claim 1, wherein the first inductor and the second inductor are magnetic inductors, and wherein the first inductance is larger than the second inductance.

13. The inductor array of claim 1, further comprising:
a fourth inductor with the third inductance, and wherein the fourth inductor is switched at the third frequency.

14. An integrated voltage regulator, comprising:
a plurality of voltage domains, wherein individual ones of the plurality of voltage domains comprises:
a plurality of inductors, wherein three or more of the plurality of inductors are operated at different phases from one another, and
wherein the three or more of the plurality of inductors are switched at different frequencies from one another.

15. The integrated voltage regulator of claim 14, wherein a first inductor of the plurality of inductors has a first inductance, and wherein the first inductor is switched at a first frequency, and wherein a second inductor of the plurality of inductors has a second inductance that is larger than the first inductance, and wherein the second inductor is switched at a second frequency that is lower than the first frequency.

16. The integrated voltage regulator of claim 15, wherein the first inductor is an air core inductor and the second inductor is an air core inductor.

17. The integrated voltage regulator of claim 15, wherein the first inductor is an air core inductor and the second inductor is a magnetic inductor, and wherein the magnetic inductor comprises a coaxial magnetic integrated inductor, a planar magnetic integrated inductor, or a discrete inductor.

18. The integrated voltage regulator of claim 15, wherein the first inductor is a magnetic inductor and the second inductor is a magnetic inductor.

19. The integrated voltage regulator of claim 15, further comprising:
a frequency multiplier connected to the first inductor.

20. The integrated voltage regulator of claim 15, further comprising:
a frequency divider connected to the second inductor.

21. The integrated voltage regulator of claim 14, wherein the integrated voltage regulator is a fully integrated voltage regulator (FIVR).

22. An electronic system, comprising:
a package substrate;
a first inductor embedded in the package substrate, wherein the first inductor has a first inductance;
a second inductor embedded in the package substrate, wherein the second inductor has a second inductance that is different than the first inductance;
a third inductor embedded in the package substrate, wherein the third inductor has a third inductance that is different than the first inductance and the second inductance;
a die electrically coupled to the package substrate, wherein the die comprises:
a voltage regulator circuitry block, wherein the voltage regulator circuitry block is electrically coupled to the first inductor, the second inductor and the third inductor, and wherein the voltage regulator circuitry block provides a first switching frequency to the first inductor, a second switching frequency that is different than the first switching frequency to the second inductor, and a third switching frequency that is different than the first switching frequency and the second switching frequency to the third inductor.

23. The electronic system of claim 22, wherein the first inductor comprises:
a plated through hole via; and
a magnetic shell surrounding the plated through hole via, and wherein the second inductor comprises one or more conductive loops.

24. The electronic system of claim 23, wherein the first inductance is larger than the second inductance, and wherein the first switching frequency is lower than the second switching frequency.

25. The electronic system of claim 22, further comprising:
a board, wherein the package substrate is electrically coupled to the board.

* * * * *